(12) United States Patent
Chikamori et al.

(10) Patent No.: US 11,913,803 B2
(45) Date of Patent: Feb. 27, 2024

(54) DATA COMPRESSION METHOD, NON-TRANSITORY COMPUTER-READABLE STORAGE MEDIUM, AND DATA COMPRESSION DEVICE

(71) Applicant: HONDA MOTOR CO., LTD., Tokyo (JP)

(72) Inventors: Hidetoshi Chikamori, Saitama (JP); Kazumasa Nakamura, Saitama (JP); Hitoshi Konishi, Saitama (JP); Takuji Harayama, Saitama (JP); Tomoaki Masakawa, Tokyo (JP); Naofumi Aso, Saitama (JP); Ryo Matsuzawa, Tokyo (JP); Zhaoqi Wang, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 196 days.

(21) Appl. No.: 17/571,593

(22) Filed: Jan. 10, 2022

(65) Prior Publication Data
US 2022/0221302 A1    Jul. 14, 2022

(30) Foreign Application Priority Data

Jan. 12, 2021  (JP) .................................. 2021-002772

(51) Int. Cl.
*G01C 21/00*   (2006.01)
*H03M 7/30*    (2006.01)
*G01C 21/34*   (2006.01)

(52) U.S. Cl.
CPC ..... *G01C 21/3822* (2020.08); *G01C 21/3469* (2013.01); *H03M 7/30* (2013.01)

(58) Field of Classification Search
CPC . G01C 21/3822; G01C 21/3469; H03M 7/30; H03M 7/70; G06F 16/2272; G06F 16/29; G06Q 50/30

See application file for complete search history.

(56) References Cited

U.S. PATENT DOCUMENTS

| | | | |
|---|---|---|---|
| 2003/0142523 A1* | 7/2003 | Biacs | G01S 19/50 365/1 |
| 2003/0154798 A1* | 8/2003 | Weyand | G01G 19/086 73/760 |
| 2007/0106465 A1* | 5/2007 | Adam | G08G 1/0969 701/533 |
| 2010/0022352 A1* | 1/2010 | Kasama | G01C 21/20 482/1 |
| 2020/0089241 A1* | 3/2020 | Kao | G05D 1/0217 |

FOREIGN PATENT DOCUMENTS

JP        2020091122 A     6/2020

* cited by examiner

*Primary Examiner* — Keith D Bloomquist
(74) *Attorney, Agent, or Firm* — Armstrong Teasdale LLP

(57) ABSTRACT

A data compression method is used for compressing data indicating a gradient of a route. The data compression method includes: acquiring a gradient table that shows gradient values in respective sections arranged between a starting point of the route and an ending point thereof, the sections including one section and an adjacent section adjacent to the one section: ranking the gradient values; and in a case where the gradient value of the one section and the gradient value of the adjacent section are in a same rank, integrating the gradient value of the one section and the gradient value of the adjacent section and generating a compressed gradient table that shows a distance and a corresponding rank of the section having the same rank.

6 Claims, 9 Drawing Sheets

DATA COMPRESSION METHOD, NON-TRANSITORY COMPUTER-READABLE STORAGE MEDIUM, AND DATA COMPRESSION DEVICE

TECHNICAL FIELD

The present invention relates to a data compression method, a non-transitory computer-readable storage medium, and a data compression device for reducing a data amount of a gradient table that shows a gradient of a road.

BACKGROUND ART

A known information processing device stores a road network for calculating energy consumption in a route having a gradient (for example, JP2020-91122A). The information processing device disclosed in JP2020-91122A stores the road network expressed as links and nodes.

A gradient table is associated with each link of the road network. When a road corresponding to the link is divided into a plurality of sections based on a gradient thereof, the gradient table shows distances of respective sections in the link. A navigation device acquires energy consumption at a time when a vehicle travels in each link by referring to the gradient table associated with the link, and calculates the energy consumption in the route having a gradient by adding up the acquired energy consumption in each link.

As disclosed in JP2020-91122A, gradient data is useful for calculating the energy consumption, and thus may be added to a high-precision map used for autonomous travel or a map stored in the navigation device.

However, since the high-precision map includes information on road ends, road shoulder edges, delimiting lines, roadways, and the like, the data amount of the high-precision map is large. Similarly, the data amount of the map stored in the navigation device becomes large due to the sophistication of the navigation device. Accordingly, it is desirable that a technique for reducing a data amount of data indicating a gradient of a route should be developed.

SUMMARY OF THE INVENTION

In view of the above background, an object of the present invention is to provide a data compression method, a non-transitory computer-readable storage medium, and a data compression device for reducing a data amount of data indicating a gradient of a route.

To achieve such an object, one aspect of the present invention provides a data compression method for compressing data indicating a gradient of a route, the data compression method comprising: acquiring a gradient table (TA) that shows gradient values in respective sections arranged between a starting point of the route and an ending point thereof (step ST1), the sections including one section and an adjacent section adjacent to the one section: ranking the gradient values (step ST2 and step ST12); and in a case where the gradient value of the one section and the gradient value of the adjacent section are in a same rank, integrating the one section and the adjacent section and generating a compressed gradient table (TB) that shows a distance and a corresponding rank of the section having the same rank (step ST3).

According to this aspect, by integrating the sections, it is possible to compress the data since it is not necessary to separately store the gradient values in the same rank.

In the above aspect, preferably, in the step of ranking the gradient values, ranking the gradient values by rounding the gradient values off to a nearest prescribed digit or disregarding fractions of less than the prescribed digit of the gradient values.

According to this aspect, it is possible to easily rank the gradient values.

In the above aspect, preferably, wherein in the step of ranking the gradient values, ranking the gradient values such that power consumption at a time when an electric vehicle travels on a road with each gradient value becomes uniform.

According to this aspect, it is possible to generate the compressed gradient table with the data compressed from the gradient table while preventing the calculation accuracy of the power consumption from decreasing.

In the above aspect, preferably, in the step of ranking the gradient values, acquiring a gradient reference value (Q) at which the power consumption becomes zero, a first gradient unit corresponding to a reciprocal of an inclination of the power consumption at the gradient value greater than the gradient reference value, and a second gradient unit corresponding to the reciprocal of the inclination of the power consumption at the gradient value smaller than the gradient reference value, the second gradient unit being greater than the first gradient unit: and ranking each gradient value based on the first gradient unit in a case where the gradient value is greater than the gradient reference value, and ranking each gradient value based on the second gradient unit in a case where the gradient value is smaller than the gradient reference value.

According to this aspect, it is possible to easily rank the gradient values.

To achieve such an object, one aspect of the present invention provides a non-transitory computer-readable storage medium, comprising a data compression program for compressing data indicating a gradient of a route, wherein the data compression program, when executed by a processor, executes a data compression method comprising: acquiring a gradient table (TA) that shows gradient values in respective sections arranged between a starting point of the route and an ending point thereof (step ST1), the sections including one section and an adjacent section adjacent to the one section: ranking the gradient values (step ST2 and step ST12); and in a case where the gradient value of the one section and the gradient value of the adjacent section are in a same rank, integrating the one section and the adjacent section so as to reduce a data amount of the gradient table (step ST3).

According to this aspect, by integrating the sections, it is possible to compress the data since it is not necessary to separately store the gradient values in the same rank.

To achieve such an object, one aspect of the present invention provides a data compression device (16) for compressing data indicating a gradient of a route, the data compression device comprising a controller configured to execute the successive steps of: acquiring a gradient table (TA) that shows gradient values in respective sections arranged between a starting point of the route and an ending point thereof (step ST1), the sections including one section and an adjacent section adjacent to the one section: ranking the gradient values (step ST2 and step ST12); and in a case where the gradient value of the one section and the gradient value of the adjacent section are in a same rank, integrating the one section and the adjacent section so as to reduce a data amount of the gradient table (step ST3).

According to this aspect, by integrating the sections, it is possible to compress the data since it is not necessary to separately store the gradient values in the same rank.

Thus, according to the above aspects, it is possible to provide a data compression method, a non-transitory computer-readable storage medium, and a data compression device for reducing a data amount of data indicating a gradient of a route.

BRIEF DESCRIPTION OF THE DRAWING(S)

DETAILED DESCRIPTION OF THE INVENTION

In the following, a data compression method, a non-transitory computer-readable storage medium including a data compression program, and a data compression device according to an embodiment of the present invention will be described with reference to the drawings.

The First Embodiment

Figure 1:
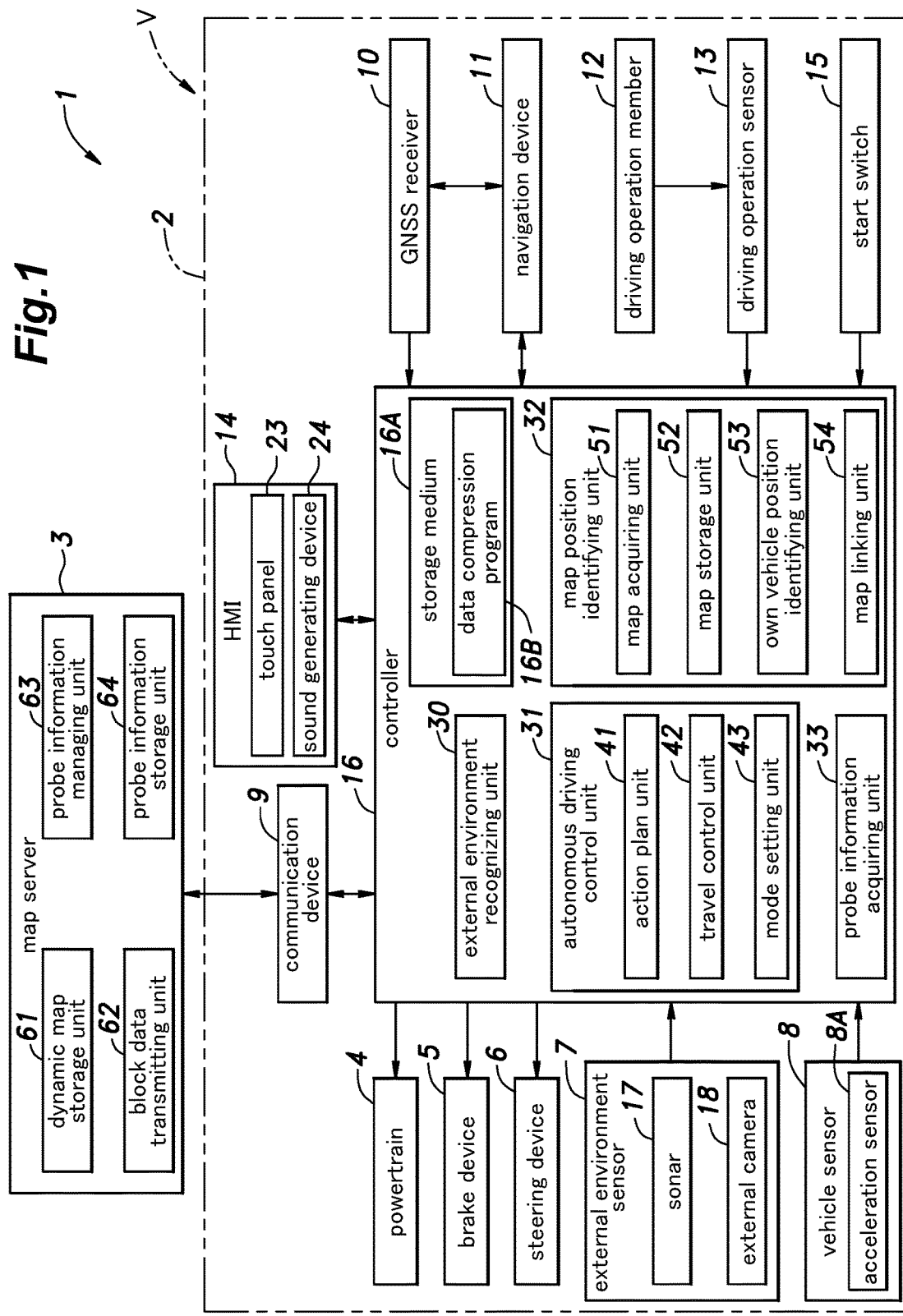
FIG. 1 is a functional block diagram showing the configuration of a map information system for executing a gradient table generating method according to a first embodiment.

As shown in FIG. 1, the data compression method is a method for compressing map data (in particular, data relating to a gradient), and is executed in a map information system 1. The map information system 1 includes a vehicle system 2 mounted on a vehicle (see "V" in FIG. 1), and a map server 3 connected to the vehicle system 2 via a network.

<The Vehicle System>

First, the vehicle system 2 will be described. The vehicle system 2 includes a powertrain 4, a brake device 5, a steering device 6, an external environment sensor 7, a vehicle sensor 8, a communication device 9, a GNSS receiver 10, a navigation device 11, a driving operation member 12, a driving operation sensor 13, an HMI 14, a start switch 15, and a controller 16. Each component of the vehicle system 2 is connected to each other via a communication means such as Controller Area Network (CAN) such that signals can be transmitted therebetween.

The powertrain 4 is a device configured to apply a driving force to the vehicle. For example, the powertrain 4 includes at least one of an internal combustion engine (such as a gasoline engine and a diesel engine) and an electric motor. The brake device 5 is a device configured to apply a brake force to the vehicle. For example, the brake device 5 includes a brake caliper configured to press a pad against a brake rotor and an electric cylinder configured to supply an oil pressure to the brake caliper. The brake device 5 may further include a parking brake device configured to restrict rotation of wheels via wire cables. The steering device 6 is a device configured to change the steering angles of the wheels. For example, the steering device 6 includes a rack-and-pinion mechanism configured to steer the wheels and an electric motor configured to drive the rack-and-pinion mechanism. The powertrain 4, the brake device 5, and the steering device 6 are controlled by the controller 16.

The external environment sensor 7 is a sensor configured to detect an object outside the vehicle or the like by capturing electromagnetic waves, sound waves, or the like from the surroundings of the vehicle. The external environment sensor 7 includes a plurality of sonars 17 and a plurality of external cameras 18. The external environment sensor 7 may further include a millimeter wave radar and/or a laser lidar. The external environment sensor 7 is configured to output a detection result to the controller 16.

Each sonar 17 consists of a so-called ultrasonic sensor. The sonar 17 emits ultrasonic waves to the surroundings of the vehicle and captures the reflected waves therefrom, thereby detecting a position (distance and direction) of the object. The plurality of sonars 17 are provided at a rear part and a front part of the vehicle, respectively.

Each external camera 18 is a device configured to capture an image of the surroundings of the vehicle. For example, the external camera 18 is a digital camera that uses a solid imaging element such as a CCD and a CMOS. The external camera 18 may consist of a stereo camera or a monocular camera. The plurality of external cameras 18 include a front camera configured to capture an image in front of the vehicle, a rear camera configured to capture an image behind the vehicle, and a pair of side cameras configured to capture images on both lateral sides of the vehicle.

The vehicle sensor 8 is a sensor configured to detect the state of the vehicle. The vehicle sensor 8 includes a vehicle speed sensor configured to detect the speed of the vehicle, an acceleration sensor 8A configured to detect the front-and-rear acceleration and the lateral acceleration of the vehicle, a yaw rate sensor configured to detect the angular velocity around a yaw axis of the vehicle, a direction sensor configured to detect the direction of the vehicle, and the like. For example, the yaw rate sensor may consist of a gyro sensor. The vehicle sensor 8 may further include an inclination sensor configured to detect the inclination of a vehicle body and a wheel speed sensor configured to detect the rotational speed of each wheel.

In the present embodiment, the vehicle sensor 8 includes a 6-axis inertial measurement unit (IMU) configured to detect the front-and-rear acceleration, the lateral acceleration, the vertical acceleration, the roll rate (the angular velocity around a roll axis), the pitch rate (the angular velocity around a pitch axis), and the yaw rate (the angular velocity around a yaw axis).

The communication device 9 is configured to mediate communication between the controller 16 and a device (for example, the map server 3) outside the vehicle. The communication device 9 includes a router configured to connect the controller 16 to the Internet. The communication device 9 may have a wireless communication function of mediating wireless communication between the controller 16 (namely, the controller 16 of the own vehicle) and the controller of the surrounding vehicle and between the controller 16 and a roadside device on a road.

The GNSS receiver 10 (the own vehicle position identifying device) is configured to receive a signal (hereinafter referred to as "the GNSS signal") from each of positioning satellites that constitute a Global Navigation Satellite System (GNSS). The GNSS receiver 10 is configured to output the received GNSS signal to the navigation device 11 and the controller 16.

The navigation device 11 consists of a computer provided with known hardware. The navigation device 11 is configured to identify the current position (latitude and longitude) of the vehicle based on the previous travel history of the vehicle and the GNSS signal outputted from the GNSS receiver 10. The navigation device 11 is configured to store data (hereinafter referred to as "the navigation map data") on roads of a region or a country on which the vehicle is traveling. The navigation device 11 is configured to store the navigation map data in a RAM, an HDD, an SSD, or the like.

The navigation device 11 is configured to set, based on the GNSS signal and the navigation map data, a route from a current position of the vehicle to a destination input by an occupant, and output the route to the controller 16. When the vehicle starts traveling, the navigation device 11 provides the occupant with route guidance to the destination.

Figure 2A:
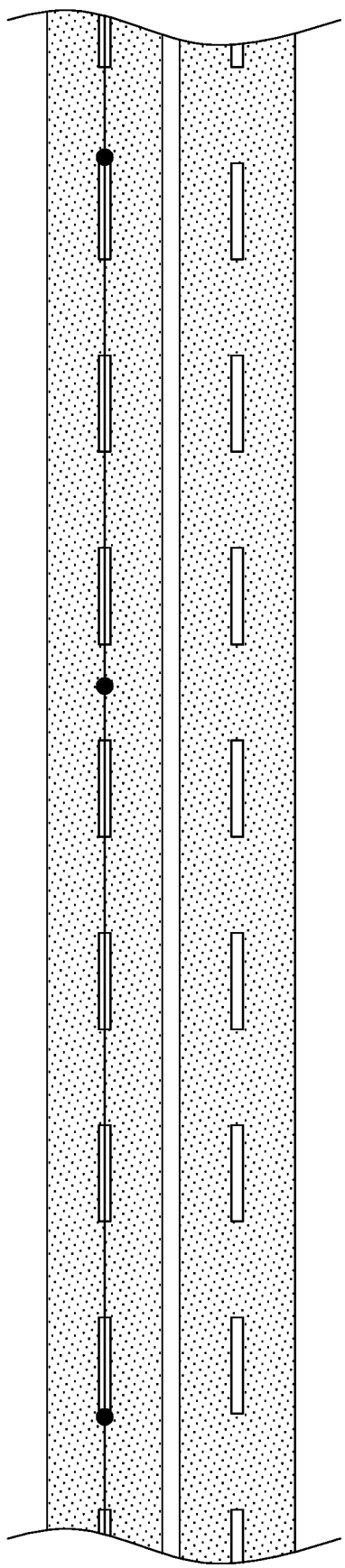
FIG. 2A is an explanatory diagram for explaining a navigation map data.

As shown in FIG. 2A, the navigation device 11 is configured to store, as information on roads on a map, information on points (nodes: see black circles in FIG. 2A) arranged on each road and line segments (links) connecting the nodes.

For example, each node stored in the navigation device 11 may be provided at a characteristic point such as an intersection or a merging point. The navigation device 11 is configured to store each link in association with a distance between the nodes connected by the link. The navigation device 11 is configured to acquire an appropriate route from the current position of the vehicle to the destination based on the distances between the nodes, and output information indicating the route to the controller 16. The outputted information indicating the route includes the points (nodes) on the road corresponding to the route and the links corresponding to vectors connecting the nodes.

The driving operation member 12 is provided in a vehicle cabin and configured to accept an input operation the occupant performs to control the vehicle. The driving operation member 12 includes a turn signal lever, a steering wheel, an accelerator pedal, and a brake pedal. The driving operation member 12 may further include a shift lever, a parking brake lever, and the like.

The driving operation sensor 13 is a sensor configured to detect an operation amount of the driving operation member 12. The driving operation sensor 13 includes a turn signal lever sensor configured to detect an input operation on the turn signal lever by the occupant, a steering angle sensor configured to detect an operation amount of the steering wheel, an accelerator sensor configured to detect an operation amount of the accelerator pedal (an accelerator opening degree), and a brake sensor configured to detect an operation amount of the brake pedal. The driving operation sensor 13 is configured to output the detected operation amount to the controller 16. The turn signal lever sensor is configured to detect the operation input (input operation) to the turn signal lever and an indicating direction corresponding to the operation input. The driving operation sensor 13 may further include a grip sensor configured to detect that the occupant grips the steering wheel. For example, the grip sensor consists of at least one capacitive sensor provided on an outer circumferential portion of the steering wheel.

The HMI 14 is configured to notify the occupant of various kinds of information by display and/or voice, and accept an input operation by the occupant. For example, the HMI 14 includes a touch panel 23 and a sound generating device 24. The touch panel 23 includes a liquid crystal display, an organic EL display, or the like, and is configured to accept the input operation by the occupant. The sound generating device 24 consists of a buzzer and/or a speaker. The HMI 14 is configured to display a driving mode switch button on the touch panel 23. The driving mode switch button is a button configured to accept a switching operation of a driving mode (for example, an autonomous driving mode and a manual driving mode) of the vehicle by the occupant.

The HMI 14 also functions as an interface to mediate the input to/the output from the navigation device 11. Namely, when the HMI 14 accepts the input operation of the destination by the occupant, the navigation device 11 starts a route setting to the destination. Further, when the navigation device 11 provides the route guidance to the destination, the HMI 14 displays the current position of the vehicle and the route to the destination.

The start switch 15 is a switch for starting the vehicle system 2. Namely, the occupant presses the start switch 15 while sitting on the driver's seat and pressing the brake pedal, and thus the vehicle system 2 is started.

The controller 16 consists of at least one electronic control unit (ECU) including a CPU, a ROM, a RAM, and the like. The CPU executes operation processing according to a program, and thus the controller 16 executes various types of vehicle control. The controller 16 may consist of one piece of hardware, or may consist of a unit including plural pieces of hardware. The functions of the controller 16 may be at least partially executed by hardware such as an LSI, an ASIC, and an FPGA, or may be executed by a combination of software and hardware.

<The Controller>

As shown in FIG. 1, the controller 16 includes an external environment recognizing unit 30, an autonomous driving control unit 31 (ADAS: Advanced Driver-Assistance Systems), a map position identifying unit 32 (MPU: Map Positioning Unit), and a probe information acquiring unit 33. These components may be composed of separate electronic control units and connected to each other via a gateway (central gateway: CGW). Alternatively, these components may be composed of an integrated electronic control unit.

The external environment recognizing unit 30 is configured to recognize an object that is present in the surroundings of the vehicle based on the detection result of the external environment sensor 7, and thus acquire information on the position and size of the object. The object recognized by the external environment recognizing unit 30 includes delimiting lines, lanes, road ends, road shoulders, and obstacles, which are present on the travel route of the vehicle.

Each delimiting line is a line shown along a vehicle travel direction. Each lane is an area delimited by one or more delimiting lines. Each road end is an end of the road. Each road shoulder is an area between the delimiting line arranged at an end in the vehicle width direction and the road end. For example, each obstacle may be a barrier (guardrail), a utility pole, a surrounding vehicle, a pedestrian, or the like.

The external environment recognizing unit 30 is configured to recognize the position of the object around the vehicle with respect to the vehicle by analyzing the image captured by each external camera 18. For example, the external environment recognizing unit 30 may recognize the distance and direction from the vehicle to the object in a top view around the vehicle body by using a known method such as a triangulation method or a motion stereo method. Further, the external environment recognizing unit 30 is configured to analyze the image captured by the external camera 18, and determine the type (for example, the delimiting line, the lane, the road end, the road shoulder, the obstacle, or the like) of each object based on a known method.

The autonomous driving control unit 31 includes an action plan unit 41, a travel control unit 42, and a mode setting unit 43.

The action plan unit 41 is configured to create an action plan for causing the vehicle to travel. The action plan unit 41 is configured to output a travel control signal corresponding to the created action plan to the travel control unit 42.

The travel control unit 42 is configured to control the powertrain 4, the brake device 5, and the steering device 6 based on the travel control signal from the action plan unit 41. Namely, the travel control unit 42 is configured to cause the vehicle to travel according to the action plan created by the action plan unit 41.

The mode setting unit 43 is configured to switch the driving mode of the vehicle between the manual driving mode and the autonomous driving mode based on the input operation (switching operation) on the HMI 14. In the manual driving mode, the travel control unit 42 controls the powertrain 4, the brake device 5, and the steering device 6 in response to the input operation on the driving operation member 12 (for example, the steering wheel, the accelerator pedal and/or the brake pedal) by the occupant, thereby causing the vehicle to travel. On the other hand, in the autonomous driving mode, the occupant does not need to perform the input operation on the driving operation member 12, and the travel control unit 42 controls the powertrain 4, the brake device 5, and the steering device 6, thereby causing the vehicle to travel autonomously. Namely, a driving automation level of the autonomous driving mode is higher than that of the manual driving mode.

The map position identifying unit 32 includes a map acquiring unit 51, a map storage unit 52, an own vehicle position identifying unit 53, and a map linking unit 54.

The map acquiring unit 51 is configured to access the map server 3 and acquire dynamic map data, which is high-precision map information, from the map server 3. For example, as the navigation device 11 sets the route, the map acquiring unit 51 acquires the latest dynamic map data of an area corresponding to the route from the map server 3 via the communication device 9.

The dynamic map data is more detailed than the navigation map data stored in the navigation device 11, and includes static information, semi-static information, semi-dynamic information, and dynamic information. The static information includes 3D map data that is more precise than the navigation map data. The semi-static information includes traffic regulation information, road construction information, and wide area weather information. The semi-dynamic information includes accident information, traffic congestion information, and small area weather information. The dynamic information includes signal information, surrounding vehicle information, and pedestrian information.

Figure 2B:
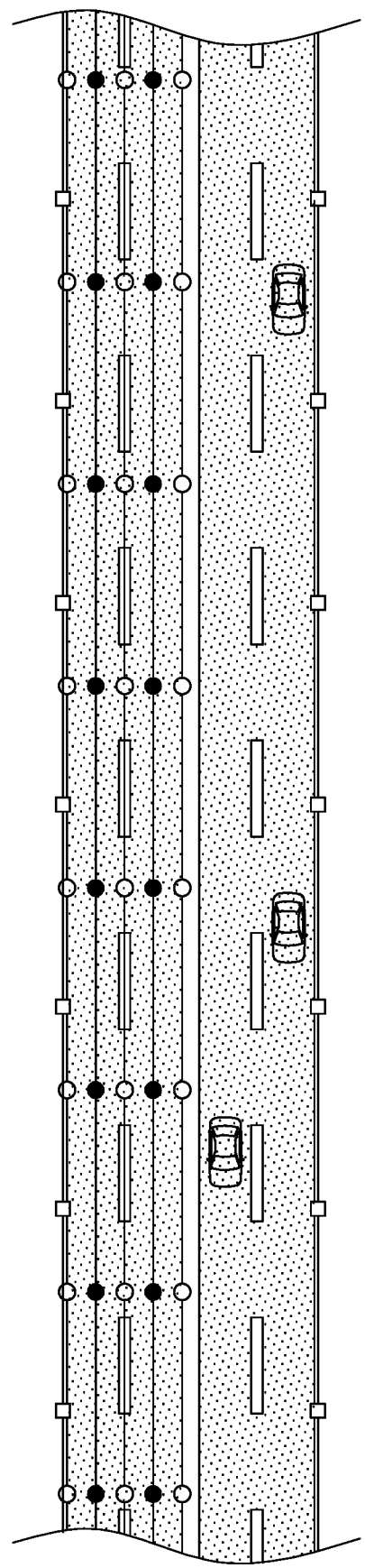
FIG. 2B is an explanatory diagram for explaining a high-precision map.

The static information (high-precision map) of the dynamic map data is data including more detailed information (more specifically, information on the road or the like required for the travel of the vehicle) than the navigation map data. For example, as shown in FIG. 2B, the static information of the dynamic map data includes information on the lanes (for example, the number of lanes) on the travel route and information on each delimiting line (for example, the type of the delimiting line) on the travel route. For example, the delimiting line of the static information is expressed as nodes (see white circles in FIG. 2B) arranged at smaller intervals than the nodes of the navigation map data and links connecting the nodes.

Further, each lane of the static information is also expressed as nodes (hereinafter referred to as "the lane nodes": see black circles in FIG. 2B) arranged at prescribed intervals and links (hereinafter referred to as "the lane links") connecting the nodes (the lane nodes). Each lane node is generated between the nodes of two delimiting lines adjacent to each other in a direction perpendicular to the links of the delimiting lines. The lane nodes are arranged along the road at prescribed intervals, and the lane links connect the lane nodes.

The high-precision map (the static information) further includes information on road shoulder edges. Each road shoulder edge is an end of the roadway on which the vehicle travels. When the roadway and a sidewalk are provided, the road shoulder edge means a boundary therebetween. The road shoulder edge of the static information is expressed as nodes (see white squares in FIG. 2B: hereinafter referred to as "the road shoulder edge nodes") arranged along the road shoulder edge at approximately the same intervals as the nodes of the delimiting line and links (hereinafter referred to as "the road shoulder edge links") connecting the nodes (the road shoulder nodes).

As shown in FIG. 2B, information (for example, an arrow) indicating the travel direction and gradient information is added to each lane link (hereinafter sometimes simply referred to as "link") of the high-precision map. The gradient information indicates a relationship between each link and a gradient value thereof, and is stored in a gradient table TA. The gradient value indicates an inclination (a gradient) of each link with respect to the horizontal direction. The gradient value may be expressed as a value ("1%" or the like) of a vertical length with respect to a horizontal length as a reference (1). Alternatively, the gradient value may be expressed as an inclination angle ("1°" or the like) of the link with respect to the horizontal plane. In the present embodiment, the gradient value is expressed as the inclination angle of the link with respect to the horizontal plane.

The map storage unit 52 includes a storage unit such as an HDD and an SSD. The map storage unit 52 is configured to store various kinds of information for causing the vehicle to travel autonomously in the autonomous driving mode. The map storage unit 52 is configured to store the dynamic map data acquired by the map acquiring unit 51 from the map server 3.

The own vehicle position identifying unit 53 is configured to identify the position (latitude and longitude) of the vehicle, namely the own vehicle position based on the GNSS signal received by the GNSS receiver 10.

The own vehicle position identifying unit 53 is configured to calculate a movement amount (a movement distance and a movement direction: hereinafter referred to as "the DR movement amount") of the vehicle by using dead reckoning (for example, odometry) based on a detection result of the vehicle sensor 8 (IMU or the like). For example, the own vehicle position identifying unit 53 is configured to identify the own vehicle position based on the DR movement amount when the GNSS signal cannot be received. Further, the own vehicle position identifying unit 53 may execute a process for improving the identification accuracy of the own vehicle position by correcting, based on the DR movement amount, the own vehicle position identified from the GNSS signal.

The map linking unit 54 is configured to extract, based on the route output from the navigation device 11, a corresponding route on the high-precision map stored in the map storage unit 52.

When the vehicle is given an instruction to start traveling autonomously, the action plan unit 41 creates a global action plan (for example, a lane change, merging, branching, or the like) based on the route extracted by the map linking unit 54. After that, when the vehicle starts traveling autonomously, the action plan unit 41 creates a more detailed action plan (for example, an action plan for avoiding danger or the like) based on the global action plan, the own vehicle position identified by the own vehicle position identifying unit 53, the object recognized by the external environment recognizing unit 30, the high-precision map stored in the map storage unit 52, or the like. The travel control unit 42 controls the travel of the vehicle based on the created detailed action plan.

The probe information acquiring unit 33 associates the own vehicle position, which is identified by the own vehicle position identifying unit 53 based on the GNSS signal, with the data detected by at least one of the external environment sensor 7, the vehicle sensor 8, and the driving operation sensor 13, thereby acquiring and storing the own vehicle position and the data as probe information.

The probe information acquiring unit 33 is configured to calculate an attitude angle of the vehicle based on the detection result of the vehicle sensor 8 (more specifically, IMU), and acquire a gradient value of a road surface. The probe information acquiring unit 33 is configured to store (hold) the acquired gradient value as the probe information. Further, the probe information acquiring unit 33 may acquire the gradient value of the road surface based on the accelerator opening degree acquired by the accelerator sensor. Alternatively, the probe information acquiring unit 33 may acquire the gradient value of the road surface based on the vehicle speed acquired by the vehicle sensor 8 (more specifically, vehicle speed sensor) and the attitude angle of the vehicle.

The probe information acquiring unit 33 appropriately transmits the acquired probe information to the map server 3.

<The Map Server>

Next, the map server 3 will be described. As shown in FIG. 1, the map server 3 is connected to the controller 16 via the network (in the present embodiment, the Internet). The map server 3 is a computer including a CPU, a ROM, a RAM, and a storage unit such as an HDD and an SSD.

The dynamic map data is stored in the storage unit of the map server 3. The dynamic map data stored in the storage unit of the map server 3 covers a wider area than the dynamic map data stored in the map storage unit 52 of the controller 16. The dynamic map data includes a plurality of block data (partial map data) corresponding to each area on the map. Preferably, each of the block data corresponds to a rectangular area on the map divided in the latitude direction and the longitude direction.

Upon receiving a request for data from the controller 16 (the map acquiring unit 51) via the communication device 9, the map server 3 transmits the dynamic map (the dynamic map data) corresponding to the requested data to the corresponding controller 16. The transmitted data (the dynamic map data) may include the traffic congestion information, the weather information, and the like.

As shown in FIG. 1, the map server 3 includes a dynamic map storage unit 61, a block data transmitting unit 62, a probe information managing unit 63, and a probe information storage unit 64.

The dynamic map storage unit 61 consists of a storage unit, and is configured to store a dynamic map in an area wider than an area in which the vehicle travels. The block data transmitting unit 62 is configured to accept a transmission request for specific block data from the vehicle, and transmit the block data corresponding to the transmission request to the vehicle.

The probe information managing unit 63 is configured to receive the probe information appropriately transmitted from the vehicle. The probe information storage unit 64 is configured to store (hold) the probe information acquired (received) by the probe information managing unit 63. The probe information managing unit 63 appropriately executes statistical processing and the like based on the probe information stored in the probe information storage unit 64, thereby executing an updating process for updating the dynamic map.

Figure 3:
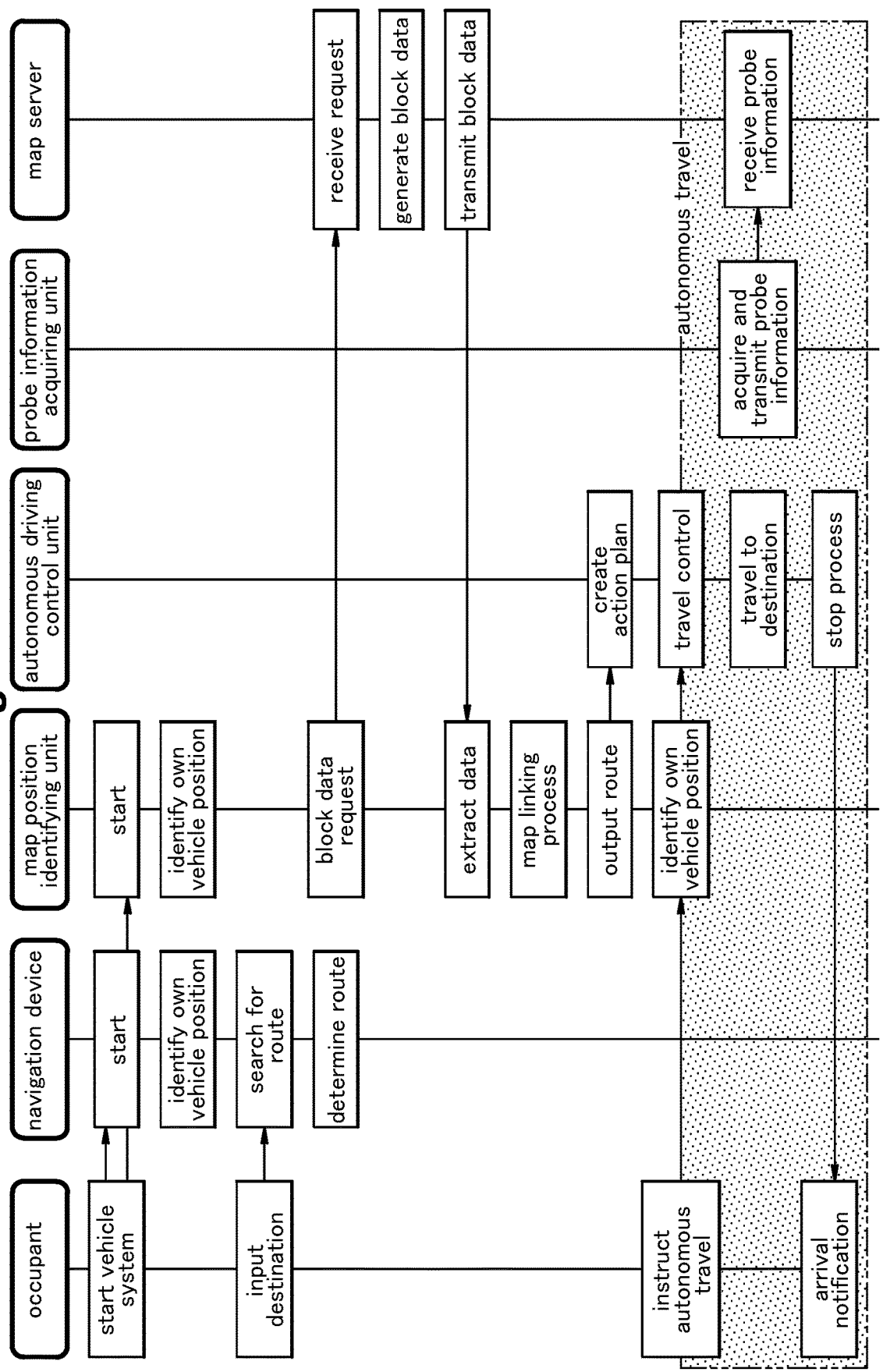
FIG. 3 is a sequence diagram for explaining the operation executed by the map information system in a case where a vehicle travels autonomously.
Figure 4:
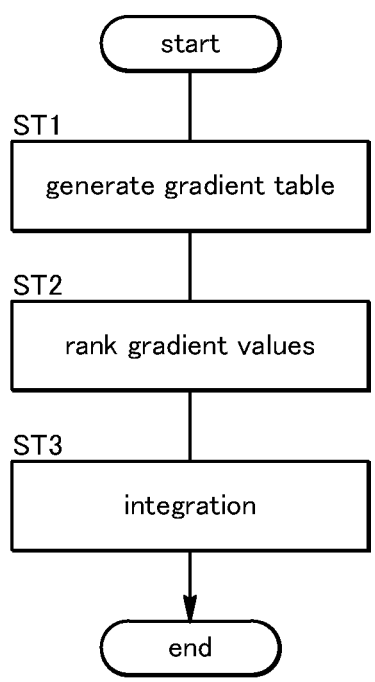
FIG. 4 is a flowchart of a data compression process according to the first embodiment.

Next, the operation of the vehicle system 2 will be described. The vehicle system 2 is started as the occupant boards the vehicle and presses the start switch 15 while pressing the brake pedal. After that, as the occupant inputs the destination and makes an input to start autonomous travel to the HMI 14, the vehicle travels autonomously and arrives at the destination. FIG. 3 shows a sequence diagram from the start of the vehicle to the arrival at the destination. Hereinafter, the outline of the processing (operation) executed by the autonomous driving control unit 31, the map position identifying unit 32, the probe information acquiring unit 33, and the map server 3 when the vehicle travels autonomously and arrives at the destination will be described with reference to FIG. 3.

When the start switch 15 is pressed and the vehicle system 2 starts, the navigation device 11 and the map position identifying unit 32 each identify the own vehicle position based on the GNSS signal from the satellites.

After that, when the occupant inputs the destination to the HMI 14, the navigation device 11 determines the route from the current position to the destination based on the navigation map data, and outputs the determined route to the map position identifying unit 32. The map position identifying unit 32 requests the map server 3 to transmit the corresponding block data based on the acquired route.

Upon receiving the request (block data request) from the map position identifying unit 32, the map server 3 generates the corresponding block data based on the route set (determined) by the navigation device 11 and the position of the vehicle, and transmits the generated block data to the map position identifying unit 32 (the vehicle system 2).

The block data transmitted from the map server 3 includes the gradient information indicating the relationship between each lane link in the route and the gradient value of the road surface corresponding to the lane link.

Upon receiving the block data, the map position identifying unit 32 acquires (extracts) the data relating to the dynamic map around the vehicle from the block data. After that, the map position identifying unit 32 (the map linking unit 54) executes a map linking process and outputs, to the autonomous driving control unit 31, the route on the high-precision map corresponding to the route in the block data from the departure point to the destination set (determined) by the navigation device 11. After that, the autonomous driving control unit 31 (the action plan unit 41) creates the global action plan according to the route on the high-precision map.

When an input to instruct the vehicle to travel autonomously is made on the HMI 14, the map position identifying unit 32 identifies the own vehicle position, and the autonomous driving control unit 31 sequentially creates the more detailed action plan based on the identified own vehicle position, the position of the object recognized by the external environment recognizing unit 30, and the like. The autonomous driving control unit 31 (the travel control unit 42) controls the vehicle according to the created action plan, thereby causing the vehicle to travel autonomously.

In the present embodiment, the autonomous driving control unit 31 acquires, from the map position identifying unit 32, the gradient information indicating the relationship between each lane link and the gradient value of the corresponding lane link, and selects the route based on the gradient information such that the route matches the action plan and power consumption is minimized.

When the vehicle starts traveling, the probe information acquiring unit 33 starts acquiring the probe information. While the vehicle is traveling, the probe information acquiring unit 33 appropriately transmits the acquired probe information to the map server 3 as the probe information during autonomous driving. Upon receiving the probe information during autonomous driving, the map server 3 stores (holds) the received probe information, and appropriately updates the dynamic map based on the probe information.

The probe information includes the gradient value of the road surface acquired from the detection result of the vehicle sensor 8 (more specifically, IMU). The map server 3 appropriately updates the gradient value added to each lane link of the high-precision map based on the gradient value of the road surface included in the probe information.

When the vehicle arrives at the destination, the autonomous driving control unit 31 executes a stop process for stopping the vehicle, and the HMI 14 displays a notification that the vehicle arrives at the destination.

When the vehicle is traveling, the map position identifying unit 32 appropriately outputs, to the autonomous driving control unit 31, information on each lane link in a prescribed range of a scheduled travel route of the vehicle based on the route on the high-precision map. At this time, the map position identifying unit 32 extracts the data including the information on the gradient value corresponding to the scheduled travel route from the gradient information acquired from the map server 3, and outputs the extracted data to the autonomous driving control unit 31.

The map position identifying unit 32 acquires the gradient information (the information on the gradient value corresponding to the scheduled travel route) from the map server 3 as the gradient table TA. After that, so as to reduce a data amount of the gradient information acquired from the map server 3, the map position identifying unit 32 executes a data compression process to generate a compressed gradient table TB, and outputs the compressed gradient table TB to the autonomous driving control unit 31. That is, the data compression process is a process for executing the data compression method for generating the compressed gradient table TB whose data is compressed from the date of the gradient table TA. The data compression process is realized by the data compression program executed by the controller 16 (map position identifying unit 32). That is, as shown in FIG. 1, the controller 16 includes a non-transitory computer-readable storage medium 16A including a data compression program 16B for compressing data indicating the gradient of the route, and the data compression program 16B, when executed by the map position identifying unit 32 (processor), executes the data compression method.

Next, the details of the data compression process executed by the map position identifying unit 32 will be described.

In the first step ST1 of the data compression process, the map position identifying unit 32 acquires the scheduled travel route within a prescribed range (distance) in front of the vehicle based on the action plan and the route on the high-precision map. After that, the map position identifying unit 32 acquires (generates) the gradient table TA by extracting a part corresponding to the scheduled travel route from the gradient information acquired from the map server 3. Upon completing the acquisition of the gradient table TA, the map position identifying unit 32 executes step ST2.

Figure 5:
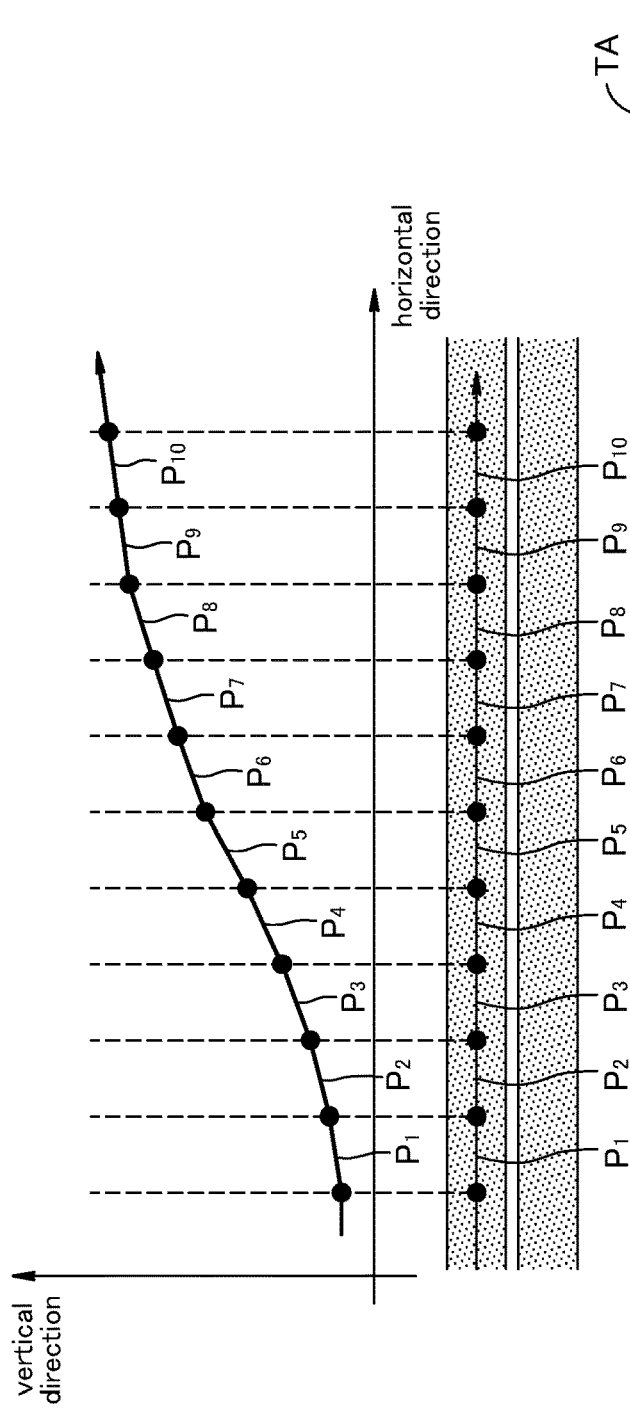
FIG. 5A is a graph showing an example of links and a gradient on a travel route.
FIG. 5B is an example of a gradient table.
FIG. 5C is a table showing ranks corresponding to respective links (respective gradient values)
FIG. 5D is an example of a compressed gradient table (selection gradient table)

FIG. 5A is a graph showing an example of a gradient of a road corresponding to lane links $P_1$ to $P_{10}$ (examples of sections) in the scheduled travel route. FIG. 5B is an example of the gradient table TA corresponding to FIG. 5A.

In step ST2, the map position identifying unit 32 ranks the respective gradient values recorded in the gradient table TA. The map position identifying unit 32 ranks the gradient values by rounding the gradient values off to the nearest prescribed digit (in the present embodiment, one decimal place) or disregarding fractions of less than the prescribed digit of the gradient values. The map position identifying unit 32 expresses the rank (the gradient value) of each lane link by using the gradient value of the corresponding number of digits (in the present embodiment, the gradient value of one decimal place or more) (see FIG. 5C). Upon completing the ranking of the gradient values, the map position identifying unit 32 executes step ST3.

In step ST3, with respect to each lane link in the route, the map position identifying unit 32 integrates the gradient value (rank) of one lane link and the gradient value (rank) of an adjacent lane link (the lane link adjacent to the one lane link) of the gradient table TA and generates the compressed gradient table TB in a case where the gradient value of the one lane link and the gradient value of the adjacent lane link are in the same rank.

More specifically, as shown in FIG. 5D, in a case where the gradient value of the one lane link and the gradient value of the adjacent lane link are in the same rank (for example, the gradient values of the lane links $P_2$ to $P_7$ are in the same rank 1.3°), the map position identifying unit 32 integrates the one lane link and the adjacent lane link into a lane link, and expresses the integrated lane link by using one rank (1.3°). In other words, the map position identifying unit 32 integrates the gradient value of the one lane link and the gradient value of the adjacent lane link into a gradient value, and expresses the integrated gradient value by using one rank (1.3°). The compressed gradient table TB shows the name of the lane link ($P_7$) at the rear end as a name indicating the integrated lane link. Further, the compressed gradient table TB shows the rank (the gradient value) and the length (distance) corresponding to each lane link.

Upon completing the integration of the lane links (gradient values), the map position identifying unit 32 outputs the compressed gradient table TB as a selection gradient data (selection gradient table).

Next, the effect of the data compression process executed in this way will be described.

As is understood by comparing FIGS. 5B and 5D, respective gradient values are recorded for lane links $P_2$ to $P_7$ in the gradient table TA (FIG. 5B), while one integrated gradient value (one integrated rank) is recorded for lane links $P_2$ to $P_7$ in the compressed gradient table TB (FIG. 5D). In this way, by integrating the lane links (the gradient values), it is possible to compress the data since it is not necessary to separately store the gradient values in the same rank.

Figure 6:
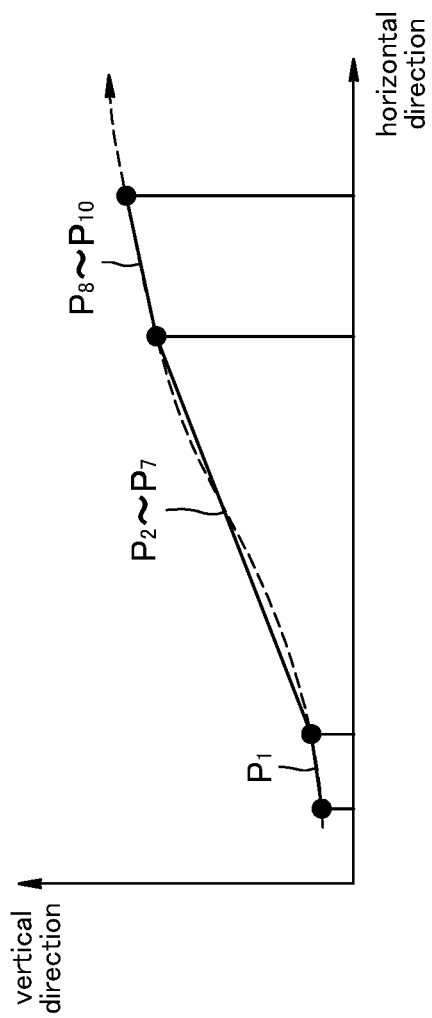
FIG. 6 is a graph showing a gradient approximately reproduced based on the compressed gradient table shown in FIG. 5D.

It is possible to approximately reproduce the gradient by estimating that each lane link has a constant gradient based on the compressed gradient table TB (FIG. 5D). In FIG. 6, the gradient shown in FIG. 5A is indicated by a broken line, and the gradient acquired based on the compressed gradient table TB (FIG. 5D) is indicated by a solid line. As shown in FIG. 6, by using the compressed gradient table TB, it is possible to approximately reproduce an actual gradient (see the broken line in FIG. 6A).

In the present embodiment, in step ST2, the map position identifying unit 32 ranks the gradient values by rounding the gradient values off to the nearest prescribed digit or disregarding fractions of less than the prescribed digit of the gradient values. Accordingly, it is possible to easily rank the gradient values.

Second Embodiment

Figure 7:
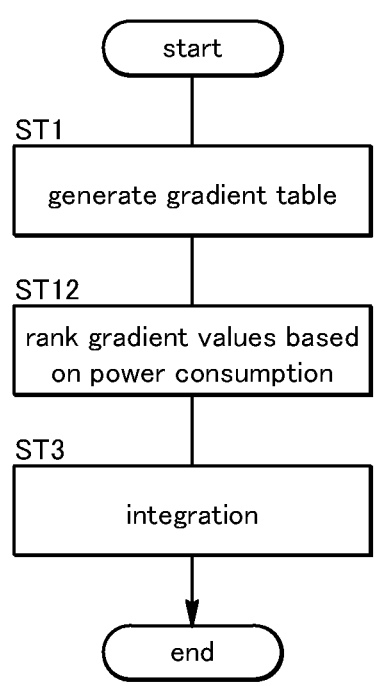
FIG. 7 is a flowchart of a data compression process according to a second embodiment.

As shown in FIG. 7, a data compression process according to the second embodiment differs from the data compression process according to the first embodiment in that step ST12 is executed instead of step ST2 and each gradient value is expressed as the value (%) of a vertical length with respect to a horizontal length as a reference (1). With respect to other configurations, the second embodiment is substantially the same as the first embodiment, and thus the description of other configurations will be omitted.

In the present embodiment, the gradient values are ranked such that power consumption at a time when an electric vehicle travels on a road with each gradient value becomes uniform.

Figure 8:
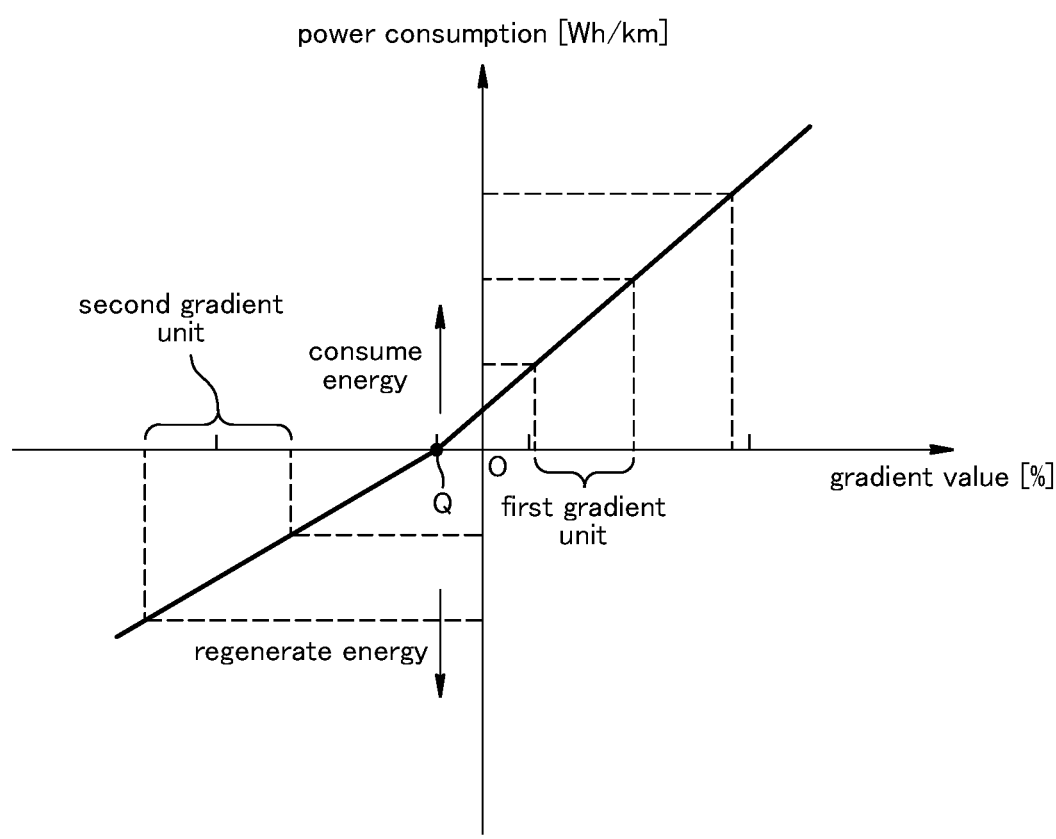
FIG. 8 is a graph showing the dependence of power consumption on a gradient value (%)

FIG. 8 is a graph showing the dependence of power consumption on the gradient value (%). An area where the power consumption is positive indicates that energy (electric power) is consumed from the battery mounted on the electric vehicle, and an area where the power consumption is negative indicates that energy (electric power) is regenerated.

As shown in FIG. 8, in a range where the gradient value is greater than a gradient value (hereafter referred to as "the gradient reference value Q") at which the power consumption becomes zero, the power consumption increases as the gradient value increases, and changes substantially linearly. In the following, the inclination of the power consumption in a case where the dependency of the power consumption on the gradient value is linearly approximated in a range where the gradient value is higher than the gradient reference value Q will be referred to as "the first inclination", and a reciprocal of the first inclination will be referred to as "the first gradient unit".

Similarly, in a range where the gradient value is smaller than the gradient reference value Q, the power consumption increases as the gradient value increases, and changes substantially linearly. In the following, the inclination of the power consumption in a case where the dependency of the power consumption on the gradient value is linearly approximated in a range where the gradient value is smaller than the gradient reference value Q will be referred to as "the second inclination", and a reciprocal of the second inclination will be referred to as "the second gradient unit". As is understood from FIG. 8, the second inclination is smaller than the first inclination and thus the second gradient unit is greater than the first gradient unit, as the regeneration cannot recover all the energy (electric power) of the vehicle.

In the present embodiment, the map position identifying unit 32 ranks the gradient values based on the first gradient unit and the second gradient unit. More specifically, the map position identifying unit 32 ranks each gradient value based on the first gradient unit in a range where the gradient value is greater than the gradient reference value Q, and ranks each gradient value based on the second gradient unit in a range where the gradient value is smaller than the gradient reference value Q. The map position identifying unit 32 expresses the gradient value of each lane link (each rank) by using a median of a gradient range of each lane link (each rank).

More specifically, the map position identifying unit 32 stores the first gradient unit, the second gradient unit, and the gradient reference value Q. When the gradient value is greater than the gradient reference value Q, the map position identifying unit 32 determines a first rank to which the gradient value belongs, and acquires the gradient value corresponding to the median of the first rank as the value corresponding to the rank of each gradient value. The first rank is included in the ranks set in the positive direction from the gradient reference value Q and divided by the first gradient unit. When the gradient value is smaller than the gradient reference value Q, the map position identifying unit 32 determines a second rank to which the gradient value belongs, and acquires the gradient value corresponding to the median of the second rank as the value corresponding to the rank of each gradient value. The second rank is included in the ranks set in the negative direction from the gradient reference value Q and divided by the second gradient unit.

When completing the acquisition of the value corresponding to the rank of each gradient value, the map position identifying unit 32 executes step ST3.

Next, the effect of the data compression process executed in this way will be described.

If the gradient values are ranked at equal intervals, the calculation error in the power consumption becomes large in a range where each gradient value is large even if the difference between the gradient value and the representative value is small. On the other hand, in the second embodiment, the gradient value is ranked such that the power consumption at a time when an electric vehicle travels on a road with each gradient value becomes uniform. Accordingly, it is possible to generate the compressed gradient table TB while suppressing the calculation error of the power consumption even if the gradient value is large.

As shown in FIG. 8, the relationship between the gradient value and the power consumption is approximated by using two different straight lines connected at the gradient reference value Q as a boundary. In the present embodiment, the gradient values are ranked based on this characteristic (relationship). That is, the gradient values are ranked by using the first gradient unit in a case where the gradient value is greater than the gradient reference value Q, and ranked by using the second gradient unit in a case where the gradient value is smaller than the gradient reference value Q. Accordingly, it is possible to easily rank the gradient values while suppressing the calculation error of the power consumption.

Concrete embodiments of the present invention have been described in the foregoing, but the present invention should not be limited by the foregoing embodiments and various modifications and alterations are possible within the scope of the present invention.

In the first embodiment, the gradient values are ranked by rounding the gradient values off to the nearest prescribed digit or disregarding fractions of less than the prescribed digit of the gradient values. However, the present invention is not limited to this embodiment. In step ST12, the map position identifying unit 32 may rank the gradient values by bringing together the same or close gradient values.

Figure 9:
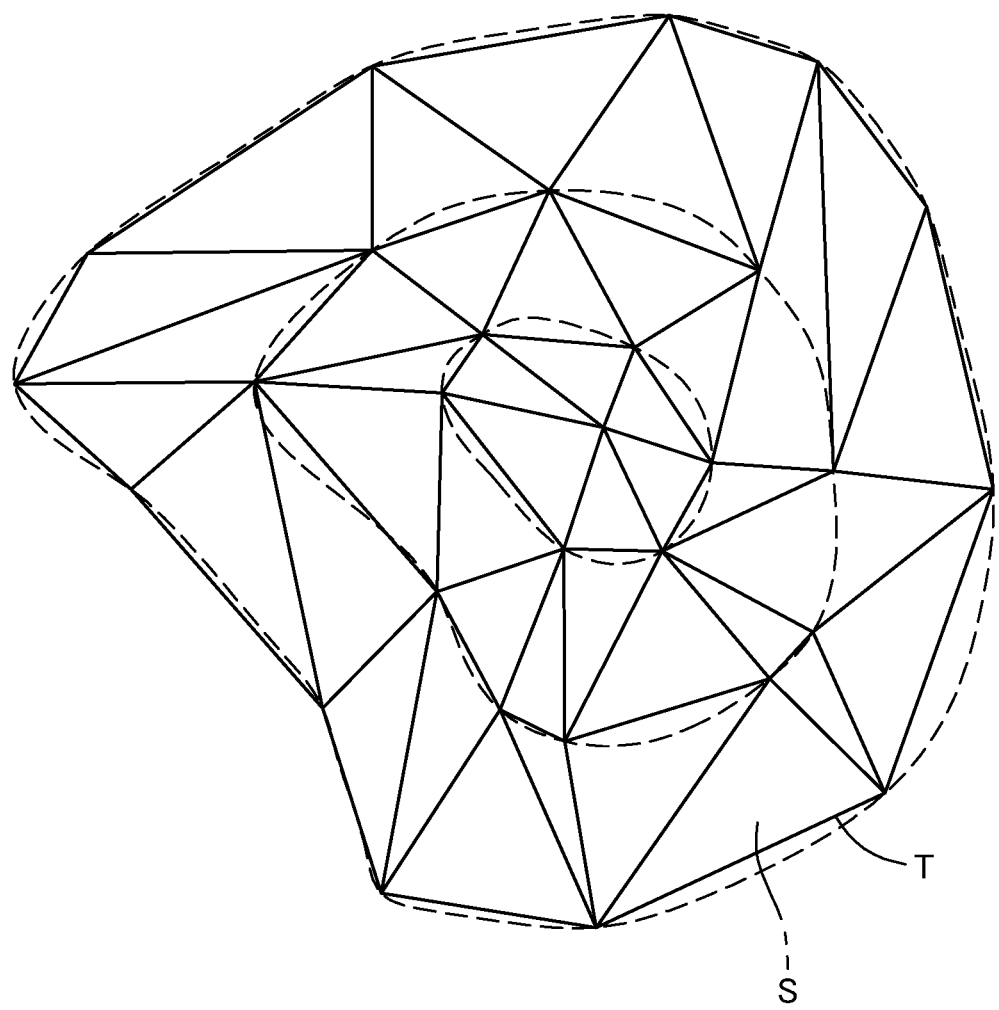
FIG. 9 is an explanatory diagram for explaining contour lines (broken lines) showing a ground surface and figures (points and solid lines connecting the points) representing the ground surface by using TIN.

In the above embodiment, the data amount of the information on the gradient is reduced by compressing the data of the gradient table TA along the route on the high-precision map. However, the present invention is not limited to this embodiment. For example, as shown in FIG. 9, the map position identifying unit 32 may store data indicating the ground surface S (contour lines thereof are indicated by broken lines in FIG. 9) by a group of triangles T (solid lines in FIG. 9) by using Triangulated Irregular Network (TIN, which can be also expressed as an irregular triangulated network, an inconsistent triangulated network, or an inconsistent triangulated network model), and calculate the gradient data of the route on the high-precision map based on the data indicating the ground surface S.

In the above embodiment, the map position identifying unit 32 compresses the data when outputting the gradient data to the autonomous driving control unit 31. However, the present invention is not limited to this embodiment. For example, the map position identifying unit 32 may execute the data compression process to compress the data amount of the gradient data when outputting the gradient data to the navigation device 11. Also, in a case where the probe information includes the gradient data, the map position identifying unit 32 may execute the data compression process to compress the data amount of the gradient data.

The invention claimed is:

1. A data compression method for compressing data indicating a gradient of a route, the data compression method comprising:
  acquiring a gradient table that shows gradient values in respective sections arranged between a starting point of the route and an ending point thereof, the sections including one section and a connecting section connecting to the one section:
  ranking the gradient values; and
  in a case where the gradient value of the one section and the gradient value of the connecting section are in a same rank, integrating the one section and the connecting section to generate a compressed gradient table with integrated section lengths and corresponding integrated section ranks ordered from the starting point.

2. The data compression method according to claim 1, wherein in the step of ranking the gradient values, ranking the gradient values by rounding the gradient values off to a nearest prescribed digit or disregarding fractions of less than the prescribed digit of the gradient values.

3. The data compression method according to claim 1, wherein in the step of ranking the gradient values, ranking the gradient values such that power consumption at a time when an electric vehicle travels on a road with each gradient value becomes uniform.

4. The data compression method according to claim 3, wherein in the step of ranking the gradient values,
  acquiring a gradient reference value at which the power consumption becomes zero, a first gradient unit corresponding to a reciprocal of an inclination of the power consumption at the gradient value greater than the gradient reference value, and a second gradient unit corresponding to the reciprocal of the inclination of the power consumption at the gradient value smaller than the gradient reference value, the second gradient unit being greater than the first gradient unit: and
  ranking each gradient value based on the first gradient unit in a case where the gradient value is greater than the gradient reference value, and ranking each gradient value based on the second gradient unit in a case where the gradient value is smaller than the gradient reference value.

5. A non-transitory computer-readable storage medium, comprising a data compression program for compressing data indicating a gradient of a route,
  wherein the data compression program, when executed by a processor, executes a data compression method comprising:
  acquiring a gradient table that shows gradient values in respective sections arranged between a starting point of the route and an ending point thereof, the sections including one section and a connecting section connecting to the one section:
  ranking the gradient values; and
  in a case where the gradient value of the one section and the gradient value of the connecting section are in a same rank, integrating the one section and the connecting section to generate a compressed gradient table with integrated section lengths and corresponding integrated section ranks ordered from the starting point.

6. A data compression device for compressing data indicating a gradient of a route, the data compression device comprising a controller configured to execute the successive steps of:
  acquiring a gradient table that shows gradient values in respective sections arranged between a starting point of the route and an ending point thereof, the sections including one section and connecting section connecting to the one section:
  ranking the gradient values; and
  in a case where the gradient value of the one section and the gradient value of the connecting section are in a same rank, integrating the one section and the connecting section to generate a compressed gradient table with integrated section lengths and corresponding integrated section ranks ordered from the starting point.

* * * * *